United States Patent
Fritzemeier et al.

(10) Patent No.: US 6,797,313 B2
(45) Date of Patent: Sep. 28, 2004

(54) SUPERCONDUCTOR METHODS AND REACTORS

(75) Inventors: Leslie G. Fritzemeier, Mendon, MA (US); Darren T. Verebelyi, Oxford, MA (US); Martin W. Rupich, Framingham, MA (US); Wei Zhang, Shrewsbury, MA (US); Qi Li, Marlborough, MA (US); Xiaoping Li, Westborough, MA (US)

(73) Assignee: American Superconductor Corporation, Westborough, MA (US)

( * ) Notice: Subject to any disclaimer, the term of this patent is extended or adjusted under 35 U.S.C. 154(b) by 104 days.

(21) Appl. No.: 10/208,134

(22) Filed: Jul. 30, 2002

(65) Prior Publication Data

US 2003/0127051 A1 Jul. 10, 2003

Related U.S. Application Data

(60) Provisional application No. 60/308,957, filed on Jul. 31, 2001.

(51) Int. Cl.[7] ............................. B05D 5/12; H01L 39/24
(52) U.S. Cl. ......................... 427/62; 29/599; 505/434; 505/470; 505/482
(58) Field of Search .................... 505/470, 482, 505/434; 117/93; 427/62; 29/599

(56) References Cited

U.S. PATENT DOCUMENTS

| | | | | |
|---|---|---|---|---|
| 4,920,094 A | * | 4/1990 | Nogawa et al. | 505/475 |
| 5,071,828 A | * | 12/1991 | Greuter et al. | 505/425 |
| 5,206,216 A | * | 4/1993 | Yoshida | 505/1 |
| 5,280,013 A | * | 1/1994 | Newman et al. | 505/330 |
| 5,350,738 A | * | 9/1994 | Hase et al. | 505/473 |
| 5,972,847 A | * | 10/1999 | Feenstra et al. | 505/473 |
| 6,231,666 B1 | * | 5/2001 | Clem et al. | 117/4 |
| 6,451,450 B1 | * | 9/2002 | Goyal et al. | 428/629 |

OTHER PUBLICATIONS

Azoulay, Jacob, "Low–temperature solid–state reaction of in situ growth of $Yba_2Cu_3O_{7-\delta}$ thin films by resistive evaporation," *Journal of Applied Physics* 72(11): 5341–5343 (Dec. 1, 1992).

Mankiewich, P.M. et al., "High critical–current density $Ba_{2Y}Cu_3O_7$ thin films produced by Coevaporation of Y, Cu, and $BaF_2$," High–Temperature Superconductors Symposium, Boston, MA USA: 119–125 (Nov. 30–Dec. 4, 1987).

Wang, X.K. et al., "Oriented thin films of YbaCu(F)O with high Tc and Jc prepared by electron beam multiplayer evaporation," Applied Physics Letters, American Institute of Physics 54(16): 1573–1575 (Apr. 1989).

* cited by examiner

Primary Examiner—Brian K. Talbot
(74) Attorney, Agent, or Firm—Fish & Richardson P.C.

(57) ABSTRACT

Superconductor reactors, methods and systems are disclosed.

35 Claims, 4 Drawing Sheets

SUPERCONDUCTOR METHODS AND REACTORS

CROSS-REFERENCE TO RELATED APPLICATION

This application claims priority under 35 U.S.C. §119 to U.S. Provisional Patent Application Ser. No. 60/308,957, filed on Jul. 31, 2001, and entitled "Superconductor Methods and Reactors," the entire contents of which are hereby incorporated by reference.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces,' PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. patent application Ser. No. 09/579,193, filed on May 26, 2000, and entitled, "Oxide Bronze Compositions And Textured Articles Manufactured In Accordance Therewith;" and U.S. Provisional Patent Application Serial No. 60/309,116, filed on Jul. 31, 2001, and entitled "Multi-Layer Superconductors And Methods Of Making Same."

TECHNICAL FIELD

The invention relates to superconductor materials, methods of making same and reactors for making same.

BACKGROUND

Multi-layer articles can be used in a variety of applications. For example, superconductors, including oxide superconductors, can be formed of multi-layer articles. Typically, such superconductors include one or more layers of superconductor material and a layer, commonly referred to as a substrate, which can enhance the mechanical strength of the multi-layer article.

Generally, in addition to enhancing the strength of the multi-layer superconductor, the substrate may desirably exhibit certain other properties. For example, the substrate may desirably have a low Curie temperature so that the substrate is not ferromagnetic at the superconductor's application temperature. Furthermore, it may be desirable for the chemical species within the substrate to not be able to diffuse into the layer of superconductor material. Moreover, the coefficient of thermal expansion of the substrate may desirably be about the same as the superconductor material. In addition, if the substrate is used for an oxide superconductor, it may be desirable for the substrate material to be relatively resistant to oxidation.

For some materials, such as yttrium-barium-copper-oxide (YBCO), the ability of the material to provide high transport current in its superconducting state typically depends upon the crystallographic orientation of the material. For example, such a material can exhibit a relatively high critical current density (Jc) when the material is biaxially textured.

As used herein, "biaxially textured surface" refers to a surface for which the crystal grains are in close alignment with a direction in the plane of the surface or in close alignment with both a direction in the plane of the surface and a direction perpendicular to the surface. One type of biaxially textured surface is a cube textured surface, in which the primary cubic axes of the crystal grains are in close alignment with a direction perpendicular to the surface and with the direction in the plane of the surface. An example of a cube textured surface is the (100)[001] surface, and examples of biaxially textured surfaces include the (011)[100] and (113)[211] surfaces.

For certain multi-layer superconductors, the layer of superconductor material is an epitaxial layer. As used herein, "epitaxial layer" refers to a layer of material whose crystallographic orientation is derived from the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is derived from the crystallographic orientation of the substrate. Thus, in addition to the above-discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and/or reduce the diffusion of chemical species between the substrate and the superconductor layer. Moreover, the buffer layer(s) can have a coefficient of thermal expansion that is well matched with the superconductor material.

In some instance, a buffer layer is an epitaxial layer, so its crystallographic orientation is derived from the crystallographic orientation of the surface onto which the buffer layer is deposited. For example, in a multi-layer superconductor having a substrate, an epitaxial buffer layer and an epitaxial layer of superconductor material (e.g., with the bulk of the superconductor material being biaxially textured), the crystallographic orientation of the surface of the buffer layer is derived from the crystallographic orientation of the surface of the substrate, and the crystallographic orientation of the layer of superconductor material is derived from the crystallographic orientation of the surface of the buffer layer. Therefore, the superconducting properties exhibited by a multi-layer superconductor having a buffer layer can depend upon the crystallographic orientation of the buffer layer surface.

In certain instances, a buffer layer is not an epitaxial layer but can be formed using ion beam assisted deposition. Typically, ion beam assisted deposition involves exposing a surface to ions directed at a specific angle relative to the surface while simultaneously depositing a material. In instances where ion beam assisted deposition is used to form a buffer layer, the crystallographic orientation of the surface of the buffer layer can be unrelated to the crystallographic orientation of the surface of the underlying layer (e.g., a substrate, such as an untextured substrate). Generally, however, the ion beam deposition parameters such as, for example, the ion energy and beam current, the temperature, the ratio of the number of atoms arriving at the surface relative to the number of ions coincidentally arriving at the surface, and the angle of incidence on the surface are selected so that the crystallographic orientation of the surface of the buffer layer provides an appropriate template for a layer that is deposited on the surface of the buffer layer (e.g., a layer of superconducting material).

In some instances, formation of a superconductor material involves the following steps. A solution is disposed on a surface (e.g., a buffer layer surface). The solution is heated to provide the superconductor material.

SUMMARY

In general, the invention relates to methods of making superconductors (superconductor films formed from a precursor), reactors that can be used to make superconductors, and systems that contain such reactors. The methods, reactors and systems can be used to provide high quality superconductor materials, such as superconductor films formed from a precursor, (e.g., high quality rare earth-alkaline earth-copper oxide superconductor materials, such as YBCO) relatively quickly. For example, the methods, reactors and systems can be used to relatively quickly form superconductor materials (e.g., superconductor films formed from a precursor) having good crystallographic orientation (e.g., YBCO with c-axis out of plane and biaxial texture in-plane) and/or good superconductivity (e.g., critical current density of at least about $5 \times 10^5$ Amperes per square centimeter and/or critical current of at least about 100 Amperes per centimeter of width).

In one aspect, the invention features a method that includes providing a film containing barium fluoride on a surface of a substrate, and impinging a first reactant gas mixture on the film. The method also includes heating the substrate to a first temperature while impinging the first reactant gas on the film to provide a superconductor material on the surface of the substrate. The first reactant gas impinges on the film at an angle that is at least about 5° relative to the surface of the substrate.

In another aspect, the invention features a method of forming a superconductor material. The method includes providing a film containing barium fluoride on a surface of a substrate to form a first article, and heating the first article while exposing the first article to a first gas environment within a first region of a reactor to form a superconductor material on the surface of the substrate, thereby forming a second article having the superconductor on the surface of the substrate. The method also includes moving the second article to a second region of the reactor, and exposing the second article to a second gas environment within the second region of the reactor so that substantially all the barium fluoride that was present in the film is converted to the superconductor material.

In another aspect, the invention features a method of making a superconductor material. The method includes impinging a reactant gas on a surface of a film containing barium fluoride to form the superconductor material. The superconductor material is supported by a surface of a substrate, and the superconductor material has a c-axis growth rate in a direction substantially perpendicular to the surface of the substrate that is at least about one Å per second.

In one aspect, the invention features a method of making a superconductor material. The method includes providing a film containing barium fluoride on a surface of a substrate, and impinging a reactant gas on a surface of the film to form the superconductor material on the surface of the substrate. A portion of the superconductor material located at a first point of a surface of the superconductor material has a first c-axis growth rate in a direction substantially perpendicular to the surface of the substrate. A portion of the superconductor material located at a second point of the surface of the superconductor material has a second c-axis growth rate in the direction substantially perpendicular to the substrate. The first c-axis growth rate in the direction substantially perpendicular to the substrate is substantially the same as the second c-axis growth rate in the direction substantially perpendicular to the substrate, and the first and second points of the surface of the superconductor material are at least about five centimeters apart.

In another aspect, the invention features a method of making a superconductor. The method includes providing a film containing barium fluoride on a surface of a substrate, and heating a reactant gas prior to contacting a surface of the film. The method also includes impinging the heated reactant gas on the surface of the film to form the superconductor.

In a further aspect, the invention features a reactor for forming a layer of a superconductor material. The reactor includes a housing, a barrier, at least one outlet, and a vacuum device. The housing is configured to hold a substrate for the layer of the superconductor material. The barrier is disposed in the interior of the housing configured to divide the interior of the housing into first and second regions. The barrier is formed of a substantially gas permeable member configured so that the first and second regions of the housing are in fluid communication. The at least one outlet is in the interior of the housing, and is configured so that, during operation when the substrate is present in the housing, a reactant gas can flow from the at least one outlet toward a surface of the substrate so that a film on the surface that contains barium fluoride can be converted to the layer of the superconductor material. The vacuum device is in fluid communication with the interior of the housing, the vacuum device being configured so that, during operation when the substrate is present in the housing, the vacuum device can remove one or more gases from a location adjacent the surface of the substrate.

In one aspect, the invention features a system for forming a layer of a superconductor material. The system includes a housing, a first gas source, a second gas source, a vacuum device, a first heater, and a second heater. The housing has first and second regions, and the housing is configured to hold a substrate for the layer of the superconductor material. The first gas source is in fluid communication with the first region of the housing so that a reactant gas can flow from the first gas source to an interior portion of the first region of the housing and so that, during operation when the substrate is present in the housing, the first reactant gas is directed toward the surface of the substrate. The second gas source is in fluid communication with the second region of the housing so that a second reactant gas can flow from the second gas source to an interior portion of the second region of the housing and so that, during operation when the substrate is present in the housing, the second reactant gas is directed toward the surface of the substrate. The vacuum device is in fluid communication with the interior of the housing, and the vacuum device is configured so that, during operation when the substrate is present in the housing, the vacuum device can remove one or more gases from a location adjacent the surface of the substrate. The first heater is adjacent the first region of the housing, and the first heater is configured to heat the first region of the housing during operation of the system. The second heater is adjacent the second region of the housing, and the second heater is configured to heat the second region of the housing during operation of the system.

In some embodiments, the invention can provide methods of making superconductor materials (e.g., superconductor films formed from a precursor) at a relatively high rate (e.g., c-axis growth rate of at least about one Angstrom per second in a direction substantially perpendicular to the surface of the substrate). The superconductor materials can have good critical current density, good critical current, and/or good crystallographic orientation.

In certain embodiments, the invention can provide methods of making superconductor materials (e.g. superconductor films formed from a precursor) in a relatively uniform manner. For example, the superconductor material can grow at a relatively uniform growth rate (e.g., along the c-axis in a direction substantially perpendicular to the surface of the substrate) at points on the surface that are relatively far removed (e.g., more than about five centimeters from each other in any given direction).

In some embodiments, the invention can provide methods of making superconductor materials (e.g., superconductor films formed from a precursor) with reduced formation of undesirable gas boundary layers at the surface (e.g., undesirable gas boundary layers of product gases).

In certain embodiments, the invention can provide methods of making superconductor materials (e.g. superconductor films formed from a precursor) while the surface is substantially unpreheated. For example, the reactant gas(es) can be pre-heated.

In some embodiments, the invention can provide methods of making superconductor materials (e.g., superconductor films formed from a precursor) that involve relatively uniform formation of the superconductor over relatively large areas.

In some embodiments, the invention can provide reactors that can be used in these and other methods.

In certain embodiments, the invention can provide a reactor that allows for relatively good reactant gas mixing.

In some embodiments, the invention can provide a reactor that allows for substantial removal of reactant gas(es).

Features, objects and advantages of the invention are in the description, drawings and claims.

DETAILED DESCRIPTION

Figure 1:
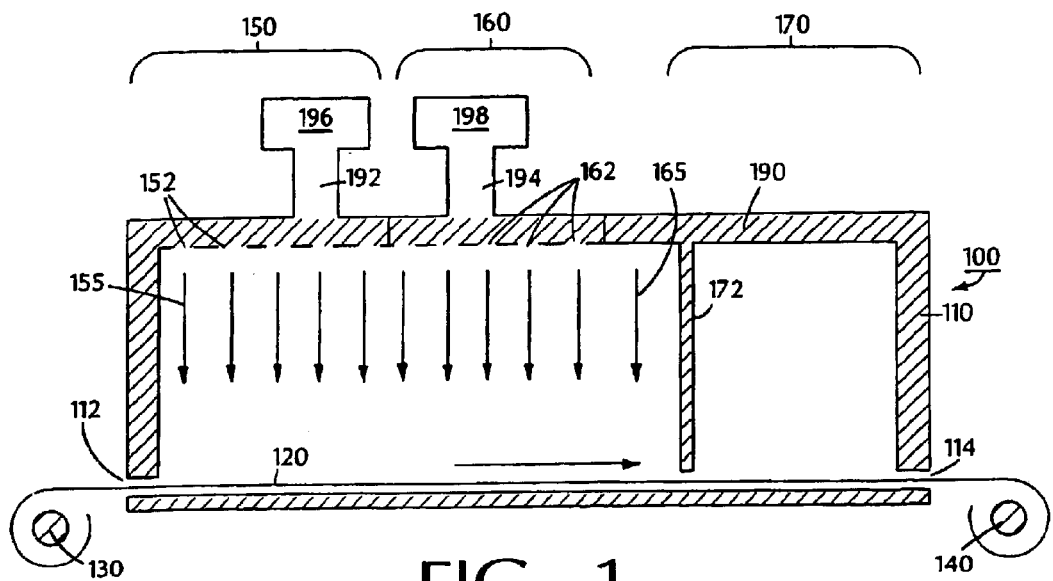
FIG. 1 is a cross-sectional view of an embodiment of a reactor.
Figure 2A:
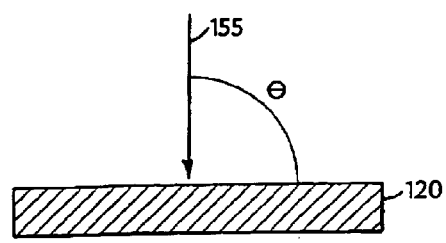
FIGS. 2A–2D show angles of a gas beam relative to the surface of a substrate.
Figure 2B:
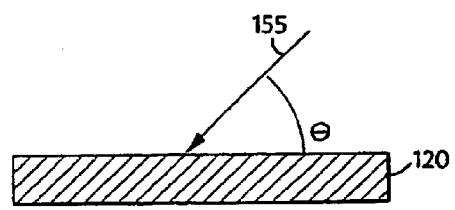
Figure 2C:
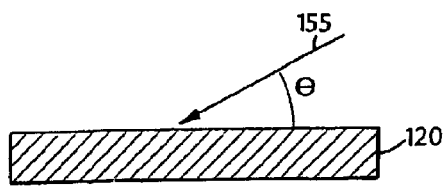
Figure 2D:
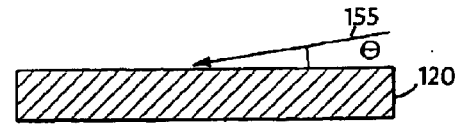

FIG. 1 shows a cross-sectional view of a reactor 100 (e.g., a tube furnace) for preparing a multi-layer superconductor article, such as a multi-layer YBCO superconductor.

Reactor 100 includes a housing 110 having openings 112 and 114. An upper wall 190 of housing 110 has passages (e.g., slots or nozzles) 192 and 194 that are in fluid communication with gas mixture sources 196 and 198. A substrate 120 (e.g., a substrate having a textured alloy layer and one or more epitaxial buffer layers disposed on thereon) is wound around reels 130 and 140, and reels 130 and 140 are rotated so that substrate 120 moves through reactor 100 via openings 112 and 114 in the direction shown by the arrow.

As substrate 120 enters reactor 100, it passes through a region 150 of reactor 100, during which time a gas mixture 155 passes through openings 152 in wall 190 and is directed toward substrate 120. Generally, a film containing a precursor (e.g., a superconductor precursor film containing barium fluoride and/or additional materials, such as CuO and/or $Y_2O_3$) is present on the surface of substrate 120 at least at some point as it moves through region 150 (e.g., present on the surface of substrate 120 as it enters region 150), and the film is exposed to gas plume 155. "Barium fluoride" as used herein refers to $BaF_2$ and partially substituted $BaF_2$ (e.g., $BaF_2$ partially substituted with yttrium and/or oxygen).

Substrate 120 then passes through a region 160 of reactor 100 during which time a gas mixture 165 passes through openings 162 in wall 190 and is directed toward substrate 120. Barium fluoride and/or a reaction product of chemistry involving barium fluoride (see discussion below) is/are present in the film disposed on the surface of substrate 120 at least at some point as it moves through region 160, and the film containing barium fluoride and/or the reaction product of chemistry involving barium fluoride is/are the exposed to gas plume 165.

Substrate 120 then passes through a region 170 of reactor 100. Region 170 is separated from region 160 by a wall 172. In certain embodiments, wall 172 is designed to reduce (e.g., minimize) the flow of gases between regions 160 and 170.

In general, the various parameters relating to reactor 100 and substrate 120 can be varied as desired. Typically, the parameters are selected so that the layer of superconductor material (e.g., YBCO) prepared on the surface of substrate 120 in reactor 100 is relatively thick, has a relatively high critical current density and/or has a relatively high critical current. In some embodiments, the layer of superconductor material has a thickness of from about 0.1 micrometer to about 20 micrometers (e.g., at least about one micrometer, at least about two micrometers, at least about three micrometers, at least about four micrometers, at least about five micrometers, from about one micrometer to about 20 micrometers, from about one micrometer to about 10 micrometers, from about one micrometer to about five micrometers). In some embodiments, the layer of superconductor material has a critical current density of at least about $5 \times 10^5$ Amperes per square centimeter (e.g., at least about $1 \times 10^6$ Amperes per square centimeter, at least about $2 \times 10^6$ Amperes per square centimeter) as determined by transport measurement at 77K in self field (i.e., no applied field) using a 1 microVolt per centimeter criterion. In certain embodiments, the layer of superconductor material has a high critical current (e.g., at least about 100 Amperes per centimeter of width, at least about 200 Amperes per centimeter of width, at least about 300 Amperes per centimeter of width, at least about 400 Amperes per centimeter of width, at least about 500 Amperes per centimeter of width).

In some embodiments, the reaction conditions in region 150 are selected so that barium fluoride in the film disposed on the surface of substrate 120 can undergo one or more chemical reactions to form one or more intermediate species (e.g., BaO) with or without the formation of the desired superconductor (e.g., YBCO). In certain embodiments, the reaction conditions selected in region 150 result in the growth of the desired superconductor (e.g., YBCO) at a rate of, for example, from about 0.5 Angstrom per second to about five Angstroms per second (e.g., from about one Angstrom per second to about three Angstroms per second, about two Angstroms per second).

In certain embodiments, the reaction conditions in region 160 are selected so that one or more intermediate species (e.g., BaO) on the surface of substrate 120 can undergo one or more chemical reactions to form a desired superconductor material (e.g., YBCO) on the surface of substrate 120. In some embodiments, the reaction conditions selected in region 160 result in the growth of the desired superconductor (e.g., YBCO) at a rate of, for example, from about one Angstroms per second to about 100 Angstroms per second (e.g., from about one Angstroms per second to about 50 Angstroms per second, from about one Angstrom per second to about 20 Angstroms per second).

In some embodiments, a portion of substrate 120 spends from about one minute to about 500 minutes (e.g., from about 10 minutes to about 250 minutes, from about 30 minutes to about 120 minutes, from about 45 minutes to about 90 minutes, about 60 minutes) in region 150 of reactor 100.

As substrate 120 passes through region 150, the temperature of substrate 120 is increased. Typically, upon entering region 150, the temperature of substrate 120 is about room temperature, and as substrate 120 exits region 150, the temperature of substrate 120 is generally about from about 675° C. to about 925° C. (e.g., from about 700° C. to about 900° C., from about 750° C. to about 850° C., from about 775° C. to about 825° C., about 800° C.)

In certain embodiments, the temperature ramp rate of substrate 120 in region 150 is from about 1° C. per minute to about 20° C. per minute (e.g., from about 2° C. per minute to about 15° C. per minute, from about 5° C. per minute to about 10° C. per minute).

Typically, gas mixture 155 contains oxygen, water and one or more inert gases (e.g., nitrogen, argon, helium, krypton, xenon). In certain embodiments, the pressure of region 150 is about one atmosphere, the partial pressure of oxygen is about 200 milliTorr, the partial pressure of water is about 20 Torr, and the remainder of the gas environment is inert gas.

Typically, gas mixture 155 impinges on substrate 120 at an angle that is substantially nonparallel to the surface of substrate 120 (e.g., at least about 5° relative to the surface of substrate 120, at least about 10° relative to the surface of substrate 120, at least about 20° relative to the surface of substrate 120, at least about 30° relative to the surface of substrate 120, at least about 40° relative to the surface of substrate 120, at least about 50° relative to the surface of substrate 120, at least about 60° relative to the surface of substrate 120, at least about 70° relative to the surface of substrate 120, at least about 80° relative to the surface of substrate 120, at least about 85° relative to the surface of substrate 120, about 90° relative to the surface of substrate 120). For example, FIGS. 2A–2D show certain angles ($\Theta$) of gas beam relative to the surface of substrate 120.

The temperature of substrate 120 in region 160 is usually about the same as the maximum temperature of substrate 120 in region 150. In some embodiments, the temperature of substrate 120 in region 160 is from 675° C. to about 925° C. (e.g., from about 700° C. to about 900° C., from about 750° C. to about 850° C., from about 775° C. to abo about 800° C.).

The temperature of substrate 120 is substantially constant during the time substrate 120 spends in region 160. In some embodiments, during the time that substrate 120 spends in region 160 the temperature of substrate 120 varies by less than about 20° C. in region 160 (e.g., less than about 10° C., less than about 5° C., less than about 2° C.).

In some embodiments, a portion of substrate 120 spends from about one minute to about 500 minutes (e.g., from about 10 minutes to about 250 minutes, from about 30 minutes to about 120 minutes, from about 45 minutes to about 90 minutes, about 60 minutes) in region 160 of reactor 100.

Typically, gas mixture 165 is substantially the same as gas mixture 155. In general, gas mixture 165 contains oxygen, water and one or more inert gases (e.g., nitrogen, argon, helium, krypton, xenon). In certain embodiments, the pressure of region 160 is about one atmosphere, the partial pressure of oxygen is about 200 milliTorr, the partial pressure of water is about 20 Torr, and the remainder of the gas environment is inert gas.

Typically, gas mixture 165 impinges on substrate 120 at an angle that is substantially nonparallel to the surface of substrate 120 (e.g., at least about 5° relative to the surface of substrate 120, at least about 10° relative to the surface of substrate 120, at least about 20° relative to the surface of substrate 120, at least about 30° relative to the surface of substrate 120, at least about 40° relative to the surface of substrate 120, at least about 50° relative to the surface of substrate 120, at least about 60° relative to the surface of substrate 120, at least about 70° relative to the surface of substrate 120, at least about 80° relative to the surface of substrate 120, at least about 85° relative to the surface of substrate 120, about 90° relative to the surface of substrate 120).

In some embodiments, a portion of substrate 120 spends from about one minute to about 500 minutes (e.g., from about 10 minutes to about 250 minutes, from about 30 minutes to about 120 minutes, from about 45 minutes to about 90 minutes, about 60 minutes) in region 170 of reactor 100.

As substrate 120 passes through region 170, the temperature of substrate 120 is decreased. Typically, upon entering region 170, the temperature of substrate 120 is about the same as the temperature of substrate 120 in region 160. In some embodiments, as substrate 120 enters region 170, the temperature of substrate 120 is from 675° C. to about 925° C. (e.g., from about 700° C. to about 900° C., from about 750° C. to about 850° C., from about 775° to about 825° C., about 800° C.).

In certain embodiments, the temperature of substrate 120 as substrate 120 exits region 120 (e.g., as substrate 120 exits reactor 100) is at most about 300° C. (e.g., at most about 200° C., at most about 100° C., at most about 50° C., about room temperature).

The rate at which the temperature of substrate 120 is decreased in region 170 can be varied as desired. In certain embodiments, the rate at which the temperature of substrate 120 is decreased in region 170 is from about 1° C. per minute to about 20° C. per minute (e.g., from about 2° C. per minute to about 15° C. per minute, from about 5° C. per minute to about 10° C. per minute).

In general, a gas plume does not impinge upon substrate 120 in region 170. Typically, the gas environment in region 170 is selected to reduce (e.g., minimize) the reaction of the superconductor material on the surface of substrate 120 with gas(es) present in the gas environment. In certain embodiments, the amount of water present in the gas environment in region 170 is small enough so that relatively little (e.g., no) reactions occur between the water in the gas environment of region 170 and the superconductor material present on the surface of substrate 120. In some embodiments, the gas environment in region 170 includes oxygen and one or more inert gases. In certain embodiments, the pressure of the gas environment in region 170 is about one atmosphere.

The temperature in regions 150, 160 and/or 170 can be controlled by heaters. For example, region 150 can be in thermal communication with one or more heaters that are controlled so that substrate 120 reaches a desired temperature at a desired rate as substrate 120 passes through region 150. Region 160 can be in thermal communication with one or more heaters that are controlled so that substrate 120 reaches a desired temperature at a desired rate as substrate 120 passes through region 160. Region 170 can be in thermal communication with one or more heaters that are controlled so that substrate 120 reaches a desired temperature at a desired rate as substrate 120 passes through region 170. In certain embodiments, one or more of the heaters for one or more of regions 150, 160 and 170 can be adjacent (e.g., in contact with) region 150, 160 and/or 170, respectively. The temperature of one or more of the heaters can be, for example, computer controlled with or without the use of one or more appropriate feedback loops. The temperature of one or more of the heaters can be, for example, manually controlled.

In certain embodiments, the gas pressure is controlled within regions 150, 160 and/or 170 by using one or more vacuum devices (e.g., pumps). For example, the gas pressure within region 150 can be controlled by disposing one or more vacuum devices in fluid communication with region 150. The gas pressure within region 160 can be controlled by disposing one or more vacuum devices in fluid communication with region 160. The gas pressure within region 170 can be controlled by disposing one or more vacuum devices in fluid communication with region 170.

Without wishing to be bound by theory, it is believed that at elevated temperatures (e.g., from about 675° C. to about 925° C., from about 700° C. to about 900° C., from about 750° C. to about 850° C., from about 775° C. to about 825° C., about 800° C.) barium fluoride can reversibly react with a reactant gas (e.g., a reactant gas containing water) to form a BaO superconductor intermediate according to the equation:

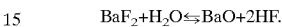

It is further believed that at these elevated temperatures the BaO superconductor intermediate can react with $Y_2O_3$ and CuO to form YBCO according to the equation:

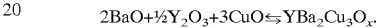

It is believed that, using reactor 100, one or more reactant gases (e.g., water) are relatively well mixed at the surface of substrate 120 and that there is a relatively small amount of certain product gases (e.g., hydrogen fluoride) present at the surface of substrate 120. It is believed that the presence of relatively well mixed reactant gas(es) at the surface of substrate 120 and/or the reduced amount of product gas(es) present at the surface of substrate 120 can enhance the ability of the reactant gas(es) (e.g., water) to react with barium fluoride to provide a BaO-containing superconductor intermediate. It is further believed that this, in turn, can enhance the quality (e.g., with respect to crystallographic orientation, such as c-axis out of plane and biaxial texture in plane) and/or the growth rate (e.g., the c-axis growth rate in a direction substantially perpendicular to the surface of the substrate) of the YBCO formed.

In general, the flow of gas mixture 155 and/or 165 can vary as desired. For example, in some embodiments, the flow of gas mixture 155 is turbulent, and in certain embodiments, the flow of gas mixture 155 is laminar. In some embodiments, the flow of gas mixture 165 is turbulent, and in certain embodiments, the flow of gas mixture 165 is laminar. Turbulent gas flow of a gas mixture can have a Reynold's number of at least about 2,100 (e.g., at least about 3,000, at least about 4,000, at least about 5,000) as it impinges upon the surface of substrate 120. In embodiments, the flow of gas mixture 155 and/or 165 is such that the reactant gases are relatively well mixed at the surface of substrate 120.

In certain embodiments, the boundary layer of reactant gas (e.g., hydrogen fluoride) present at the surface of substrate 120 is reduced (e.g., the surface of substrate 120 is substantially free of a boundary layer of hydrogen fluoride). This can be advantageous, for example, in cases where the buildup of a boundary layer of hydrogen fluoride can reduce the rate at which barium fluoride is converted to BaO superconductor intermediate.

Figure 3:
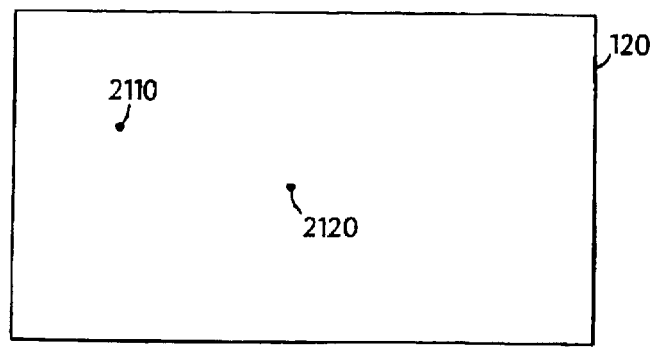
FIG. 3 is a top view of an embodiment of a superconductor article.

In some embodiments, the use of well mixed reactant gases can result in a relatively uniform c-axis growth rate across the surface of substrate 120 in a direction substantially perpendicular to the textured surface of the substrate. For example, as shown in FIG. 3, the c-axis growth rate of YBCO at point 2110 of the surface of substrate 120 can be substantially the same as the c-axis growth rate of YBCO in a direction substantially perpendicular to the textured surface of the substrate at point 2120 of the surface of substrate 120 when the distance between points 2110 and 2120 is at least about five centimeters (at least about 10 centimeters, at least about 15 centimeters, at least about 25 centimeters, at least about 50 centimeters, at least about 75 centimeters, at least about 100 centimeters, at least about 500 centimeters, at least about 750 centimeters, at least about one meter, at least about 10 meters apart, at least about 20 meters). In general, a line connecting points 2110 and 2120 can be in any direction along or across the surface of substrate 120. For example, a line connecting 2110 and 2120 can be along the width of the surface of substrate 120, can be along the length of the surface of substrate 120, or some combination thereof. This can be advantageous in certain embodiments, for example, when a substantially uniform (e.g., substantially same thickness, substantially same crystallographic orientation, substantially same critical current density and/or substantially same critical current) superconductor layer is desired across a relatively large surface, such as when the superconductor is formed in the shape of a tape. In certain embodiments, when the superconductor is in the shape of a tape, the superconductor can have a width of at least about two centimeters (e.g., at least about five centimeters, at least about eight centimeters, at least about 10 centimeters, at least about 12 centimeters, at least about 15 centimeters, at least about 17 centimeters, at least about 20 centimeters) and/or a length of at least about 0.1 meter (e.g., at least about 0.5 meter, at least about one meter, at least about 10 meters, at least about 50 meters, at least about 100 meters, at least about 500 meters, at least about one kilometer).

In certain embodiments, the c-axis growth of the superconductor material (e.g., YBCO) in a direction substantially perpendicular to the surface of substrate 120 can be relatively fast. For example, the c-axis growth rate of the superconductor material in a direction substantially perpendicular to the surface of substrate 120 can be at least about one Angstrom per second (at least about two Angstroms per second, at least about three Angstroms per second, at least about four Angstroms per second, at least about five Angstroms per second, at least about six Angstroms per second, at least about seven Angstroms per second, at least about nine Angstroms per second, at least about 10 Angstroms per second).

Figure 4:
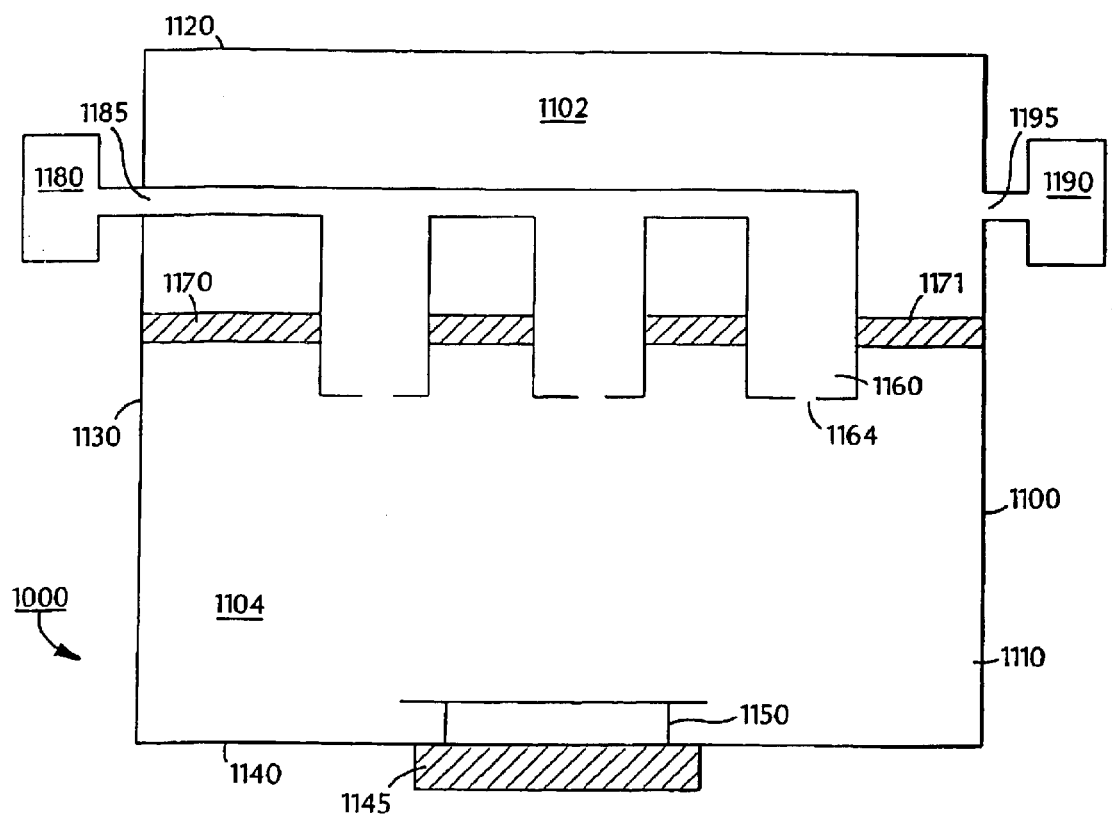
FIG. 4 is a cross-sectional view of an embodiment of a reactor.
Figure 5:
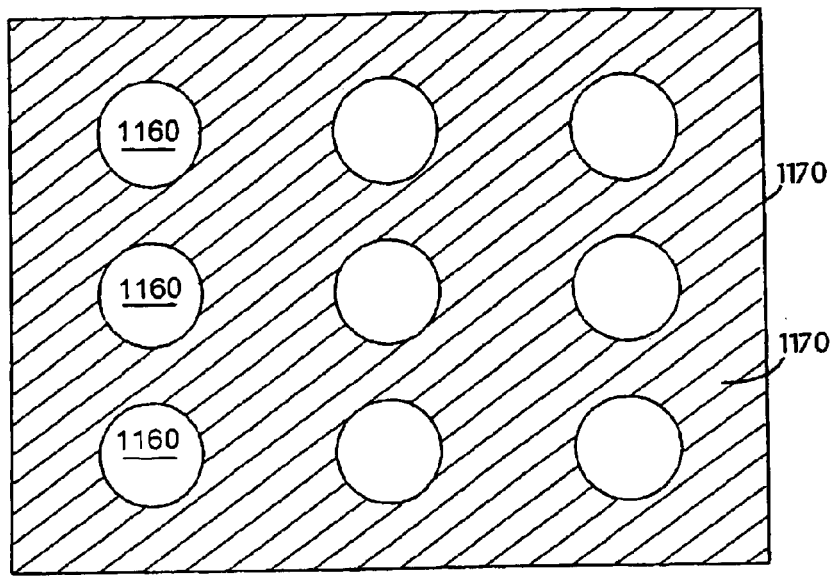
FIG. 5 is a top view of a portion of an embodiment of a reactor.

While the foregoing has described a reactor in which the substrate moves through the reactor during the formation of the superconductor material, other reactors can be used to achieve one or more of the above-noted advantages. For example, FIG. 4 is a cross-sectional view of a reactor 1000 that includes a housing 1100 having walls 1110, 1120, 1130 and 1140, a heater 1145 in thermal communication with housing 1100, and a support 1150 in thermal communication with heater 1145. Housing 1100 also includes outlets 1160 and a member 1170 between outlets 1160 so that member 1170 supports outlets 1160 (FIG. 5). Each outlet 1160 has an orifice 1164, and outlets 1160 are in fluid communication with a gas source 1180 via conduit 1185. Member 1170 is formed of a mechanically rigid and gas permeable material (e.g., a mesh material, such as Rigimesh® material, available from Pall Corporation; a drilled or machined metal or ceramic plate) so that regions 1102 (shown as being above member 1170 in FIG. 4) and 1104 (shown as being below member 1170 in FIG. 5) of reactor 1000 are in fluid communication. Member 1170 is in fluid communication with a vacuum device (e.g., a vacuum pump) 1190 via conduit 1195.

Figure 6:
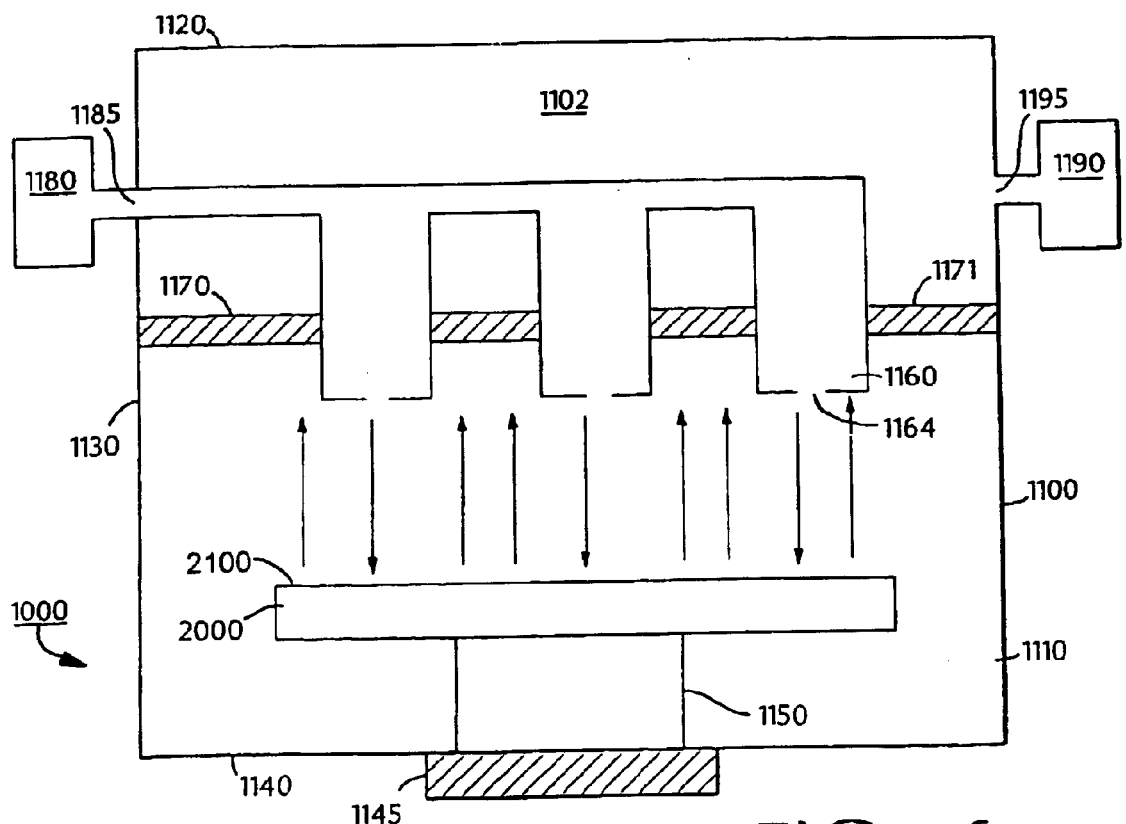
FIG. 6 is a cross-sectional view of an embodiment of a reactor during use.

FIG. 6 is a cross-sectional view of reactor 1000 during use to treat a film containing barium fluoride (and optionally one or more additional precursors, such as CuO and/or $Y_2O_3$) to provide YBCO. Reactant gases (e.g., water and/or oxygen) flow from gas source 1180 along conduit 1185, enter outlets 1160, exit outlets 1160 through orifices 1164, and impinge on surface 2100 (formed of a film containing barium fluoride) of an article 2000 disposed on support 1150. Pump 1190 removes product gases (e.g., hydrogen fluoride) from surface 2100 through member 1170 and conduit 1195.

Gas source 1180, conduit 1185 and outlets 1160 are typically designed so that the pressure and/or velocity of the gas(es) exiting orifices 1164 is substantially uniform for the different outlets 1160 at a given point in time during the use of reactor 1100. In some embodiments, the pressure and/or velocity of the gas(es) exiting orifices 1164 can be varied during use of reactor 1100.

In certain embodiments, the total pressure of the gas(es) in conduit 1185 is about atmospheric pressure. In some embodiments, higher or lower total pressures can be used. In certain embodiments, the gas pressure can be varied during use of reactor 1100.

Gas(es) emitted by outlets 1160 impinge on surface 2100 at an angle that is substantially nonparallel to surface 2100 (e.g., at least about 5° relative to surface 2100, at least about 10° relative to surface 2100, at least about 20° relative to surface 2100, at least about 30° relative to surface 2100, at least about 40° relative to surface 2100, at least about 50° relative to surface 2100, at least about 60° relative to surface 2100, at least about 70° relative to surface 2100, at least about 80° relative to surface 2100, at least about 85° relative to surface 2100, about 90° relative to surface 2100).

Gas(es) (e.g., product gas(es), such as hydrogen fluoride) removed by pump 1190 through member 1170 and along conduit 1195 leave surface 2100 so that the amount of these gases at surface 2100 is reduced. In certain embodiments, gas(es) leave surface 2100 at an angle that is substantially nonparallel to surface 2100 (e.g., at least about 5° relative to surface 2100, at least about 10° relative to surface 2100, at least about 20° relative to surface 2100, at least about 30° relative to surface 2100, at least about 40° relative to surface 2100, at least about 50° relative to surface 2100, at least about 60° relative to surface 2100, at least about 70° relative to surface 2100, at least about 80° relative to surface 2100, at least about 85° relative to surface 2100, about 90° relative to surface 2100).

While the foregoing has described the use of reactors in treating barium fluoride to form a superconductor intermediate, the use of the reactors is not limited in this sense. In some embodiments, the reactors can be used to form a layer of superconductor material using different superconductor precursors. In certain embodiments, the reactors can be used to form one or more layers of material that are not superconductive.

In embodiments in which a film containing barium fluoride is present at the surface of substrate 120 as it enters reactor 100, CuO and/or $Y_2O_3$ can also be present in the film disposed on the surface of substrate 120. Barium fluoride, CuO and/or $Y_2O_3$ can be formed in the film disposed on the surface of substrate 120 using various techniques, including, for example, solution precursor methods, and/or vapor deposition methods (e.g., chemical vapor deposition methods, physical vapor deposition methods, electron beam deposition methods). Combinations of methods can be used to deposit one or more of barium fluoride, CuO and/or $Y_2O_3$.

While the foregoing discussion has been with respect to a substrate having a film containing barium fluoride present on its surface prior to entering the reactor, the invention is not limited in this sense. In certain embodiments, one or more precursors of barium fluoride and/or other appropriate materials can be present in the film on the surface of the substrate as it enters the reactor, and the reactor can be used to form barium fluoride and/or the other appropriate materials.

Typically, in embodiments in which solution chemistry is used to prepare barium fluoride and/or other superconductor precursors, a solution (e.g., a solution containing metal salts, such as yttrium acetate, copper acetate, barium acetate and/or a fluorinated acetate salt of barium) is disposed on a surface (e.g., on a surface of a substrate, such as a substrate having an alloy layer with one or more buffer layers disposed thereon). The solution can be disposed on the surface using standard techniques (e.g., spin coating, dip coating, slot coating). The solution is dried to remove at least some of the organic compounds present in the solution (e.g., dried at about room temperature or under mild heat), and the resulting material is reacted (e.g., decomposed) in a furnace in a gas environment containing oxygen and water to form barium fluoride and/or other appropriate materials (e.g., CuO and/or $Y_2O_3$). In some embodiments, the reactors noted above can be used in any or all of these steps.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials which can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

In general, the metal salt solution can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the metal salt solution. Such compounds include, for example, salts (e.g., nitrates, acetates, alkoxides, iodides, sulfates and trifluoroacetates), oxides and hydroxides of these metals.

In certain embodiments, a metal salt solution can be formed of an organic solution containing metal trifluoroacetates prepared from powders of $Ba(O_2CCH_3)_2$, $Y(O_2CCH_3)_3$, and $Cu(O_2CCH_3)_2$ which are combined and reacted using methods known to those skilled in the art. For example, the metal trifluoroacetate powders can be combined in a 2:1:3 ratio in methyl alcohol to produce a solution substantially 0.94 M based on copper content.

In certain embodiments, the metal salt solution can contain a Lewis base. The rare earth metal can be yttrium, lanthanum, europium, gadolinium, terbium, dysprosium, holmium, erbium, thulium, ytterbium, cerium, praseodymium, neodymium, promethium, samarium or lutetium. In general, the rare earth metal salt can be any rare earth metal salt that is soluble in the solvent(s) contained in the metal salt solution and that, when being processed to form an intermediate (e.g., a metal oxyhalide intermediate), forms rare earth oxide(s) (e.g., $Y_2O_3$). Such salts can have, for example, the formula $M(O_2C—(CH_2)_n—CXX'X'')(O_2C—(CH_2)_m—CX'''X''''X''''')(O_2C—(CH_2)_p—CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated actetates (e.g., $M(O_2C—CH_3)_3$). The alkaline earth metal can be barium, strontium or calcium. Generally, the alkaline earth metal salt can be any alkaline earth metal salt that is soluble in the solvent(s) contained in the metal salt solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g, BaO). Such salts can have, for example, the formula $M'(O_2C—(CH_2)_n—CXX'X'')(O_2C—(CH_2)_m—CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the metal salt solution. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''—CO(CH)_aCO—CX'''X''''X''''')(CX''''''X'''''''X''''''''—CO(CH)_bCO CX'''''''''X''''''''''X''''''''''')$, $M''(O_2C—(CH_2)_n—CXX'X'')(O_2C—(CH_2)_m—CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X'', X''', X'''', X''''', X'''''', X''''''', X'''''''', X''''''''', X'''''''''', X''''''''''' is H, F, Cl, Br or I. R is a carbon containing group, which can be halogenated (e.g., $CH_2CF_3$) or nonhalogenated. These salts include, for example, nonhalogenated actetates (e.g., $M''(O_2C—CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. In certain embodiments, the transition metal salt is a carboxylate salt (e.g., a nonhalogenated carboxylate salt), such as a propionate salt of the transition metal (e.g., a nonhalogenated propionate salt of the transition metal). An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1R_2R_3$ are independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

Typically, the metal salt solution is applied to a surface (e.g., a buffer layer surface), such as by spin coating, dip coating, web coating, slot coating, gravure coating, or other techniques known to those skilled in the art, and subsequently heated.

The deposited solution is then heated to provide the superconductor material (e.g., YBCO). Without wishing to be bound by theory, it is believed that, in some embodiments when making YBCO, the solution is first converted to barium fluoride, the superconductor precursor is converted to a BaO superconductor intermediate, and the BaO superconductor intermediate is then converted to YBCO.

In certain embodiments, formation of barium fluoride involves heating the dried solution from about room temperature to about 200° C. at a rate of about 5° C. per minute in a nominal gas environment having a total gas pressure of about 760 torr, and containing from about five torr to about 50 torr of water and from about 0.1 torr to about 760 torr of oxygen, with the balance inert gas (e.g., nitrogen, argon). The temperature is then ramped from about 200° C. to about 220° C. at a rate of at least about 1° C. per minute (e.g., at least about 5° C. per minute, at least about 10° C. per minute, at least about 15° C. per minute, at least about 20° C. per minute) while maintaining substantially the same nominal gas environment.

In certain of these embodiments, barium fluoride is formed by heating the dried solution in moist oxygen (e.g., having a dew point in the range of from about 20° C. to about 75° C.) to a temperature in the range of from about 300° C. to about 500° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In other embodiments, heating the dried solution to form barium fluoride includes one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature. In these embodiments, heating the metal salt solution can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 5 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

In some embodiments, preparation of a superconductor material can involve slot coating the metal salt solution (e.g., onto a tape, such as a tape formed of a textured nickel tape having sequentially disposed thereon epitaxial buffer and/or cap layers, such as $Gd_2O_3$, YSZ and $CeO_2$). The coated metal salt solution can be deposited in an atmosphere containing $H_2O$ (e.g., from about 5 torr $H_2O$ to about 15 torr $H_2O$, from about 9 torr $H_2O$ to about 13 torr $H_2O$, about 11 torr $H_2O$) The balance of the atmosphere can be an inert gas (e.g., nitrogen). The total pressure during film deposition can be, for example, about 760 torr. The film can be decomposed, for example, by transporting the coated tape through a tube furnace (e.g., a tube furnace having a diameter of about 2.5 inches) having a temperature gradient. The respective temperatures and gas atmospheres of the gradients in the furnace, as well as the transport rate of the sample through each gradient, can be selected so that the processing of the film is substantially the same as according to the above-noted methods.

The foregoing treatments of a metal salt solution can result in barium fluoride. Preferably, the precursor has a relatively low defect density.

In particular embodiments, methods of treating the solution can be employed to minimize the formation of undesirable a-axis oriented oxide layer grains, by inhibiting the formation of the oxide layer until the required reaction conditions are attained.

While solution chemistry for barium fluoride formation has been disclosed, other methods can also be used. For example, solid-state, or semi solid state, precursor materials deposited in the form of a dispersion. These precursor compositions allow for example the substantial elimination of $BaCO_3$ formation in final YBCO superconducting layers, while also allowing control of film nucleation and growth. Two general approaches are presented for the formulation of such precursor compositions.

In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metal-organic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 A/cm$^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Batrifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in PCT Publication No. WO 01/08236, published on Feb. 1, 2001, and entitled "Coated Conductor Thick Film Precursor." In preferred embodiments, a superconductor layer is well-ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick).

Figure 7:
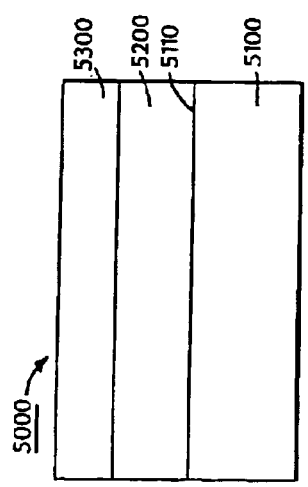
FIG. 7 is a cross-sectional view of an embodiment of a superconductor article.

FIG. 7 is a cross-sectional view of a superconductor article 5000 having a substrate 5100 with surface 5110, a buffer layer 5200, and a superconductor layer 5300.

Preferably, surface 5110 has a relatively well defined crystallographic orientation. For example, surface 5110 can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

Surface 5110 can be prepared, for example, by rolling and annealing. Surface 5110 can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), surface 5110 of substrate 5100 need not be textured (e.g., surface 5110 can be randomly oriented polycrystalline, or surface 5110 can be amorphous).

Substrate 5100 can be formed of any material capable of supporting a buffer layer stack and/or a layer of superconductor material. Examples of substrate materials that can be used as substrate 5100 include for example, metals and/or alloys, such as nickel, silver, copper, zinc, aluminum, iron, chromium, vanadium, palladium, molybdenum and/or their alloys. In some embodiments, substrate 5100 can be formed of a superalloy. In certain embodiments, substrate 5100 can be in the form of an object having a relatively large surface area (e.g., a tape or a wafer). In these embodiments, substrate 5100 is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or Ni$_3$Al, or mixtures thereof) can be formed into a rod and embedded into the alloy prior to deformation texturing.

In some embodiments, stable oxide formation at surface 5110 can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by PO2 and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

If the substrate underlying an oxide layer is insufficiently covered by a metal salt solution used to make the oxide layer, then the oxide layer will not provide the desired protection of the substrate from oxidation during deposition of the subsequent oxide layers when carried out in an oxidizing atmosphere relative to the substrate and will not provide a complete template for the epitaxial growth of subsequent layers. By heating a sol gel film, and thereby allowing the precursor to flow into the substrate grain boundary areas, complete coverage can result. The heating can be relatively low temperature, for example, from about 80° C. to about 320° C., for example, from about 100° C. to about 300° C., or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C.

This heating step can be carried out after, or concurrently with, the drying of excess solvent from the sol gel film. It must be carried out prior to decomposition of the film, however.

The carbon contamination accompanying conventional oxide film preparation in a reducing environment (e.g., 4% H2—Ar) is believed to be the result of an incomplete removal of the organic components of the film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the metal salt solution can be air dried, and then heated in an initial decomposition step. Alternatively, the metal salt solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

In certain embodiments, an epitaxial buffer layer can be formed using a low vacuum vapor deposition process (e.g., a process performed at a pressure of at least about $1\times10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ Torr, such as less than about $1\times10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1\times10^{-3}$ Torr, at least about 0.1 Torr, or at least about 1 Torr) at a surface temperature below the temperature used to grow the epitaxial layer using physical vapor deposition at a high vacuum (e.g., at most about $1\times10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

In alternate embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as Ar+ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

In certain embodiments, a buffer layer (and/or a layer of superconductor material) can be conditioned (e.g., thermally conditioned and/or chemically conditioned) so a subsequent layer is formed on a conditioned surface. The conditioned surface of the material layer can be biaxially textured (e.g., (113)[211] or (100)[011]) or cube textured (e.g., (100)[001]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature, with or without chemical conditioning, to affect changes in the surface of a material layer, such as a buffer layer or a superconductor material layer, so that the resulting surface exhibits one or more of the above noted properties. Thermal conditioning can be performed with or without the use of chemical conditioning. Preferably, thermal conditioning occurs in a controlled environment (e.g., controlled gas pressure, controlled gas environment and/or controlled temperature).

Thermal conditioning can include heating the surface of the buffer layer to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments, such as a chemical conditioning environment (e.g., an oxidizing gas environment, a reducing gas environment) or an inert gas environment.

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as BF3 and/or CF4). Chemical conditioning techniques are disclosed, for example, in Silicon Processing for the VLSI Era, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in Metallurgy and Metallurgical Engineering Series, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

Materials that can be used for buffer layers include, for example, $CeO_2$, $Y_2O_3$, $TbO_x$, $GaO_x$, YSZ, $LaAlO_3$, $SrTiO_3$, $Gd_2O_3$, $LaNiO_3$, $LaCuO_3$, $SrTuO_3$, $NdGaO_3$, $NdAlO_3$, MgO, AlN, NbN, TiN, VN and ZrN.

In general, the thickness of layer 5200 can be varied as desired. In some embodiments, layer 200 is from about 0.01 micrometer to about five micrometers thick (e.g., from about 0.02 micrometer to about one micrometer thick, from about 0.02 micrometer to about 0.75 micrometer thick).

In certain embodiments, multiple buffer layers are used. Various combinations of buffer layer materials and/or buffer layer thicknesses can be used. In some embodiments, a layer of $Y_2O_3$ or $CeO_2$ (e.g., from about 20 nanometers thick to about 50 nanometers thick) is deposited (e.g., using electron beam evaporation) onto surface 110. A layer of YSZ (e.g., from about 0.1 micrometer thick to about 0.5 micrometer thick) is deposited on the $Y_2O_3$ or $CeO_2$ surface using sputtering (e.g., magnetron sputtering). A $CeO_2$ layer (e.g., about 20 nanometers thick) is deposited (e.g., using magnetron sputtering) onto the YSZ surface. The surface of one or more of these layers can be chemically conditioned and/or thermally conditioned.

Figure 8:
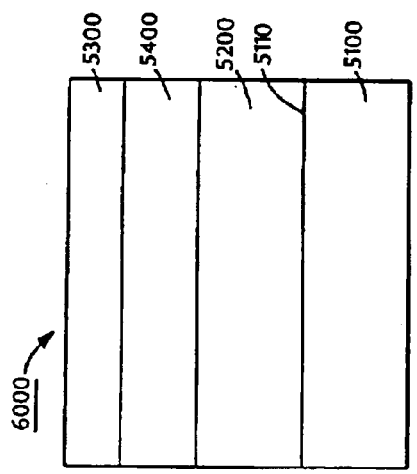
FIG. 8 is a cross-sectional view of an embodiment of a superconductor article.

While certain architectures for multi-layer articles have been described, the invention is not limited in this sense. Other architectures may also be used. For example, FIG. 8 shows a cross-sectional view of an embodiment of article 6000 that includes a cap layer 5400 between buffer layer 5200 and superconductor layer 5300. Cap layer 5400 can be formed of a material (e.g., a ceramic oxide) that provides a template for the formation (e.g., the epitaxial deposition) of layer 5300 (e.g., the epitaxial deposition of YBCO). Exemplary cap materials include $CeO_2$, $Y_2O_3$ and $SrTiO_3$.

Various combinations of buffer layers and superconductor material layers can be used. For example, multiple buffer layers can be disposed between the substrate and the superconductor layer. As another example, multiple layers of superconductor material can be used. As an additional example, combinations of buffer layers and superconductor layers (e.g., alternating buffer layers and superconductor layers) can be used.

Other arrangements can also be used.

Figure 9:
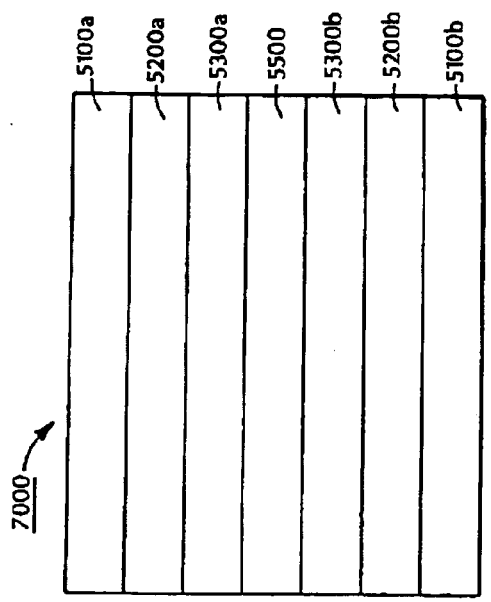
FIG. 9 is a cross-sectional view of an embodiment of a superconductor article.

FIG. 9 is a cross-sectional view of an embodiment of a superconductor article 7000 including substrates 5100a and 5100b, buffer layers 5200a and 5200b, superconductor layers 5300a and 5300b, and a joint layer 5500.

Such a multi-layer architecture can provide improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the joint layer structure. Joint layer 5500 can be formed of one or more layers, and preferably includes at least one noble metal layer. Exemplary noble metals include, for example, silver, gold, palladium, and platinum. Noble metals provide a low interfacial resistance between the HTS layer and joint layer 5500. In addition, joint layer 5500 can include a second layer of normal metal (for example, copper or aluminum or alloys of normal metals). In certain embodiments, joint layer 5500 is formed of an alloy containing one or more noble metals. In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). Joint layer 5500 deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the joint layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bi-layered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

While certain superconductor materials and their methods of preparation have been described (e.g., YBCO) other superconductor materials can also be used. Such superconductor materials include, for example, rare earth-alkaline earth-metal oxides other than YBCO, including rare earth-barium copper oxides other than YBCO, such as GdBCO and ErBCO.

Moreover, although certain embodiments of reactors have been described, the invention is not limited in this sense.

As an example, one or more outlets can be in thermal communication with one or more heaters. This can allow, for example, for pre-heating of one or more reactant gases prior to contacting the surface of the superconductor precursor. In these embodiments, one or more walls of the reactor can also be in thermal contact with one or more heaters, or the walls may not be in thermal contact with a heater. In some embodiments, the superconductor precursor can be substantially unpreheated prior to contact with the reactant gases.

As another example, the orifices in the outlets can be arranged so that gases emitted by different nozzles can interact (e.g., to enhance mixing of reactant gases). In some embodiments, the gases can interact prior to contacting the surface of the superconductor precursor. This can, for example, enhance mixing of reactant gases and/or uniformity of reactant gas flow.

As an additional example, certain outlets can each be in fluid communication with only one reactant gas source, while other outlets are in fluid communication with one or more different reactant gas sources. For example, certain outlets can be in fluid communication with one or more sources of gaseous water, while other outlets can be in fluid communication with one or more sources of gaseous oxygen. Combinations of such arrangements can also be used.

As a further example, one or more outlets can be used to emit gases that can be relatively inert (e.g., gases that do not play a substantial chemical role). Such gases include, for example, nitrogen, argon, neon, krypton and xenon. These gases can be, for example, mixed with reactant gases prior to being emitted by an outlet.

As another example, the reactor can be equipped to transport the article (e.g., tape) therethrough. For example, a conveyer belt can be used. Alternatively or additionally, a reel-to-reel apparatus can be used.

As yet another example, the reactor can be equipped to heat the article (e.g., tape) prior to or during its travel through the reactor. For example, resistive heating can be used.

Although the use of reactors have been described in certain methods of making superconductor materials from particular precursors, other precursors can also be used. In general, the reactors can be used with any precursor capable of being treated to form a superconductor material (e.g., a rare earth-alkaline earth-copper oxide, such as YBCO). Such precursors can be prepared, for example, by chemical vapor deposition, physical vapor deposition, and/or spray pyrolysis. Other techniques known to those skilled in the art may also be used to provide an appropriate superconductor precursor. These precursors can be used to form superconductor intermediates during the process of superconductor material formation. Such intermediates can be, for example, halide intermediates and/or carbonate intermediates.

Moreover, the reactors can have a variety of forms. In certain embodiments, the reactor can be a single unit. In some embodiments, the reactor can be formed of individuals chambers.

The following examples are illustrative only and not intended as limiting.

EXAMPLE 1

An epitaxial YBCO film was prepared as follows.

A biaxially-textured 95 atomic percent nickel/five atomic percent tungsten alloy substrate was prepared by cold rolling and annealing in the form of a tape (75 micrometers thick and 1 centimeter wide). A two micrometer thick layer of nickel was formed on the surface of the substrate, and a C2X2 sulfur superstructure was formed on the nickel layer.

Epitaxial oxide buffer layers were sequentially deposited to form a stack with the structure substrate/$Y_2O_3$/YSZ/$CeO_2$. The $Y_2O_3$ seed layer (50 nanometers thick) was deposited by electron beam evaporation. Both the YSZ barrier layer (300 nanometers thick) and the $CeO_2$ cap layer (30 nanometers thick) were deposited by RF sputtering.

A copper propionate, barium trifluoroacetate, yttrium trifluoroacetate based solution was web coated onto the $CeO_2$ cap layer. The film was dried at 60° C. in humid air, and the resulting material was decomposed in a humid, oxygen atmosphere at a temperature of up to 400° C., to a barium fluoride-based precursor film with stoichiometric amounts of copper and yttrium for subsequent YBCO formation.

The precursor film was continuously converted to form epitaxial superconducting YBCO in a 1.5 meter tube furnace in a humid, low oxygen partial pressure environment. The furnace had three zones. The dwell time in each zone was 60 minutes. Slots separated the first and third zones from the ambient environment. The gases in the first and second zones were allowed to mix, but a slot separated the second and third zones so that mixing of gases in these zones was minimized. The first and second zones each had an impingement nozzle formed of narrow slots spaced at one centimeter intervals and placed perpendicular about one centimeter from the tape surface to produce transverse flow.

The impingement nozzles were used to supply a gas mixture of $N_2$(balance), $O_2$ (0.015 volume percent) and water (2.6 volume percent). The gas flow exited the slots at a velocity of one meter per second. The gases were removed from the first and second zones with a vacuum to keep the pressure nominally above atmosphere. The third zone gas was dry, with the water was replaced with $N_2$.

The temperature of the substrate was ramped from 400° C. to 790° C. as it moved through the first impingement zone using resistive heating elements placed outside the quartz tubing. The temperature of the substrate is held at 790° C. in the second zone with resistive heating elements placed outside the quartz tubing. The temperature of the substrate was ramped down to 300° C. in the third zone, separate the first and third zones.

The resulting YBCO film thickness was 1.2 micrometers thick measured by SEM cross-section analysis. RBS data indicated that the film contained the mass for a fully-dense, stoichiometric 1.0 $\mu$m film.

A three micrometer thick silver cap layer was disposed on the surface of the YBCO layer. An atmospheric pressure oxygen treatment was used to oxygenate the YBCO (500° C. for 30 minutes, followed by ramp down to 300° C. at 1° C. per minute, followed by ramp down to room temperature).

The resulting material had a critical current density of about one million Amperes per square centimeter.

What is claimed is:

1. A method, comprising:
    providing a film containing barium fluoride on a surface of a substrate;
    impinging a first reactant gas mixture on the film; and
    heating the substrate to a first temperature while impinging the first reactant gas on the film to provide a superconductor material on the surface of the substrate,
    wherein the first reactant gas impinges on the film at an angle that is at least about 5° relative to the surface of the substrate so that hydrogen fluoride is removed from the surface as the first reactant gas impinges on the surface.

2. The method of claim 1, wherein the angle is at least about 10° relative to the surface of the substrate.

3. The method of claim 1, wherein, prior to impinging the first reactant gas on the surface of the film, the film further comprises copper oxide and yttrium oxide.

4. The method of claim 1, wherein the first reactant gas mixture comprises water.

5. The method of claim 1, wherein the first temperature is at least about 675° C.

6. The method of claim 1, further comprising, while the substrate is at the first temperature, directing a second reactant gas mixture toward the surface of the substrate.

7. The method of claim 6, wherein the first reactant gas mixture is different from the second reactant gas mixture.

8. The method of claim 6, wherein, while the second reactant gas mixture is directed toward the surface of the substrate, a temperature of the superconductor material is about the same as the first temperature.

9. The method of claim 8, wherein the first temperature is at least about 675° C.

10. The method of claim 6, wherein the second reactant gas is directed toward the surface of the substrate at an angle that is at least about 5° relative to the surface of the substrate.

11. The method of claim 1, wherein the substrate comprises an alloy.

12. The method of claim 11, wherein the substrate further comprises at least one layer of buffer material disposed on the alloy.

13. The method of claim 1, further comprising:
    providing a precursor solution on the surface of the substrate; and
    treating the precursor solution to provide the film containing barium fluoride on the surface of the substrate.

14. The method of claim 1, further comprising removing at least one gas from the film of the substrate at an angle that is substantially parallel to the surface of the substrate.

15. The method of claim 1, wherein, prior to impinging the first reactant gas on the surface of the film, the film further comprises copper oxide and a rare earth oxide.

16. A method of forming a superconductor material, comprising:
    providing a film containing barium fluoride on a surface of a substrate to form a first article;
    heating the first article while exposing the first article to a first gas environment within a first region of a reactor to form a superconductor material on the surface of the substrate, thereby forming a second article having the superconductor on the surface of the substrate;
    moving the second article to a second region of the reactor; and
    exposing the second article to a second gas environment within the second region of the reactor so that substantially all the barium fluoride that was present in the film is converted to the superconductor material wherein the first gas environment includes a first reactant gas that impinges on the film at an angle that is at least about 5° relative to the surface of the substrate so that hydrogen fluoride is removed from the surface as the first reactant gas impinges on the surface or the second gas environment includes a second reactant gas that impinges on the film at an angle that is at least about 5° relative to the surface of the substrate so that hydrogen fluoride is removed from the surface as the second reactant gas impinges on the surface.

17. The method of claim 16, wherein the first article is heated to a temperature of at least about 675° C. in the first region.

18. The method of claim 16, wherein a temperature of the first article in the first region is about the same as a temperature of the second article in the second region.

19. The method of claim 16, wherein the substrate comprises an alloy.

20. The method of claim 19, wherein the substrate further comprises at least one layer of buffer material disposed on the alloy.

21. The method of claim 16, wherein the reactor comprises a tube furnace.

22. The method of claim 16, further comprising:
    providing a precursor solution on the surface of the substrate; and
    heating the precursor solution to provide the film on the surface of the substrate.

23. The method of claim 16, further comprising removing at least one gas from the film of the substrate at an angle substantially parallel to the surface of the substrate.

24. A method of making a superconductor material, comprising:
  impinging a reactant gas on a surface of a film containing barium fluoride to form the superconductor material,
  wherein the superconductor material is supported by a surface of a substrate, and the superconductor material has a c-axis growth rate in a direction substantially perpendicular to the surface of the substrate that is at least about one Å per second wherein the reactant gas impinges on the film at an angle that is at least about 5° relative to the surface of the substrate so that hydrogen fluoride is removed from the surface as the reactant gas impinges on the surface.

25. The method of claim 24, wherein the superconductor material has a c-axis growth rate in a direction substantially perpendicular to the surface of the substrate that is at least about two Å per second.

26. The method of claim 24, wherein the superconductor material has a c-axis growth rate in a direction substantially perpendicular to the surface of the substrate that is at least about three Å per second.

27. The method of claim 24, further comprising removing at least one gas from the surface of the film at an angle that is substantially parallel to the surface of the substrate.

28. A method of making a superconductor material, comprising:
  providing a film containing barium fluoride on a surface of a substrate; and
  impinging a reactant gas on a surface of the film to form the superconductor material on the surface of the substrate,
  wherein a portion of the superconductor material located at a first point of a surface of the superconductor material has a first c-axis growth rate in a direction substantially perpendicular to the surface of the substrate, a portion of the superconductor material located at a second point of the surface of the superconductor material has a second c-axis growth rate in the direction substantially perpendicular to the substrate, the first c-axis growth rate in the direction substantially perpendicular to the substrate is substantially the same as the second c-axis growth rate in the direction substantially perpendicular to the substrate, and the first and second points of the surface of the superconductor material are at least about five centimeters apart wherein the reactant gas impinges on the film at an angle that is at least about 5° relative to the surface of the substrate so that hydrogen fluoride is removed from the surface as the reactant gas impinges on the surface.

29. The method of claim 28, wherein the first and second points of the surface of the superconductor material are at least about 10 centimeters apart.

30. The method of claim 28, wherein the first and second points of the surface of the superconductor material are at least about 15 centimeters apart.

31. The method of claim 28, further comprising removing at least one gas from the surface of the film at an angle that is substantially parallel to the surface of the substrate.

32. A method of making a superconductor, comprising:
  providing a film containing barium fluoride on a surface of a substrate;
  heating a reactant gas prior to contacting a surface of the film; and
  impinging the heated reactant gas on the surface of the film to form the superconductor wherein the heated reactant gas impinges on the film at an angle that is at least about 5° relative to the surface of the substrate so that hydrogen fluoride is removed from the surface as the heated reactant gas impinges on the surface.

33. The method of claim 32, wherein the surface of the film is substantially unpreheated prior to be contacted by the heated reactant gas.

34. The method of claim 32, wherein the reactant gas is heated to a temperature of at least about 100° C. prior to contacting the film.

35. The method of claim 32, further comprising removing at least one gas from the surface of the film at an angle that is substantially parallel to the surface of the substrate.

* * * * *